(12) United States Patent
Lee et al.

(10) Patent No.: US 8,836,070 B2
(45) Date of Patent: Sep. 16, 2014

(54) PHOTO DIODE, METHOD OF MANUFACTURING THE PHOTO-DIODE, AND PHOTO SENSOR INCLUDING THE PHOTO DIODE

(75) Inventors: Won-Kyu Lee, Yongin (KR); Jae-Beom Choi, Yongin (KR); Jae-Hwan Oh, Yongin (KR); Young-Jin Chang, Yongin (KR); Seong-Hyun Jin, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 200 days.

(21) Appl. No.: 13/137,726

(22) Filed: Sep. 8, 2011

(65) Prior Publication Data
US 2012/0104382 A1 May 3, 2012

(30) Foreign Application Priority Data
Nov. 2, 2010 (KR) .......................... 10-2010-0108411

(51) Int. Cl.
*H01L 33/00* (2010.01)

(52) U.S. Cl.
USPC ...... 257/458; 257/40; 257/431; 257/E31.001; 257/E31.015

(58) Field of Classification Search
USPC ........ 257/458, 431, E31.001, 31.015, 442, 40
See application file for complete search history.

(56) References Cited

U.S. PATENT DOCUMENTS

| | | | |
|---|---|---|---|
| 7,619,266 B2 | 11/2009 | Mouli | |
| 2009/0032823 A1 | 2/2009 | Im et al. | |
| 2009/0071952 A1* | 3/2009 | Kuwabara | 219/494 |
| 2011/0316427 A1* | 12/2011 | Okajima | 315/151 |

FOREIGN PATENT DOCUMENTS

| | | |
|---|---|---|
| JP | 2002-076425 | 3/2002 |
| JP | 2003-273345 | 9/2003 |
| KR | 1998-045815 | 9/1998 |
| KR | 10-2000-0027789 A | 5/2000 |
| KR | 10-2009-0013399 | 2/2009 |

* cited by examiner

*Primary Examiner* — Michael Shingleton
(74) *Attorney, Agent, or Firm* — Lee & Morse, P.C.

(57) ABSTRACT

A photo diode includes an intrinsic region on a substrate, a P+ doping region in a first portion of the intrinsic region, and an oxide semiconductor region. The oxide semiconductor region is spaced apart from the P+ doping region on a second portion of the intrinsic region and the second portion of the intrinsic region is different from the first portion of the intrinsic region.

18 Claims, 7 Drawing Sheets

PHOTO DIODE, METHOD OF MANUFACTURING THE PHOTO-DIODE, AND PHOTO SENSOR INCLUDING THE PHOTO DIODE

BACKGROUND

1. Field

Embodiments relate to a photo diode, a method of manufacturing the photo diode, and a photo sensor including the photo diode.

2. Description of the Related Art

A photo diode having a P-I-N structure may be a semiconductor device that converts a photo signal into an electrical signal. An exemplary method of driving a photo diode having the P-I-N structure may include irradiating light to a P-type doping region to which a negative (−) voltage is applied and an N-type doping region to which a positive (+) voltage is applied. Electrons and holes may be generated in an intrinsic region due to, e.g., photo energy, or electrons and holes may be generated in the N/P-type doping regions and diffuse into an intrinsic region. Due to, e.g., a reverse-direction electric field in the intrinsic region, a current may flow in the photo diode. If the intensity of light is high or the amount of energy is high, more current may flow in the photo diode. According to the amount of current, transistors may output electrical signals to drive the photo sensor.

A P-I-N structure may be formed by P+ doping and N+ doping. Such doping may result in a complicated manufacturing process and high manufacturing costs.

SUMMARY

Embodiments are directed to a photo diode including an intrinsic region, a P+ doping region, and an oxide semiconductor region.

Embodiments are also directed to a method of manufacturing the photo diode.

Embodiments are also directed to a photo sensor including the photo diode.

Embodiments may be realized by providing a photo diode including an intrinsic region formed on a substrate, a P+ doping region formed in a portion of the intrinsic region, and an oxide semiconductor region formed to be spaced apart from the P+ doping region on another portion of the intrinsic region.

The intrinsic region and the P+ doping region may lie on the same plane and the oxide semiconductor region may be disposed on the intrinsic region.

The intrinsic region may include amorphous silicon.

The intrinsic region may include polycrystalline silicon.

The oxide semiconductor region may include a Hf oxide, a Zn oxide, an In oxide, a Ga oxide, a Sn oxide, a Ti oxide, an InZn oxide, an InSn oxide, a HfInZn oxide, a GaInZn oxide, or a combination thereof.

A thickness of the oxide semiconductor region may be in a range of about 0.03 to about 1 μm.

The P+ doping region may include a Group III impurity ion.

The P+ doping region may include a boron (B) ion, a $BF_2$ ion, or a $B_2H_5$ ion.

An ion concentration of the P+ doping region may be in a range of about $1.0^{10}$ atom/cm$^2$ to about $1.0^{16}$ atom/cm$^2$.

A thickness of the P+ doping region may be in a range of about 0.03 μm to about 1 μm.

A thickness of the intrinsic region may be in a range of about 0.03 μm to about 1 μm.

Embodiments may also be realized by providing a method of manufacturing a photo diode, in which the method includes providing a substrate, forming an intrinsic region by depositing an amorphous silicon layer on the substrate, forming a P+ doping region by doping an impurity ion on a portion of the intrinsic region, and forming an oxide semiconductor region to be spaced apart from the P+ doping region on another portion of the intrinsic region.

The forming of the P+ doping region may include forming a mask covering a portion of the intrinsic region that is not the portion on which the impurity ion is to be doped, implanting a Group III impurity ion into an un-masked portion of the intrinsic region, and removing the mask.

In the implanting of the Group III impurity ion, a boron (B) ion, a $BF_2$ ion, or a $B_2H_5$ ion is implanted with an energy intensity of about 1 to about 50 KeV so that the implanted ion concentration is in a range of about $1.0^{10}$ atom/cm$^2$ to about $1.0^{16}$ atom/cm$^2$.

The forming of the oxide semiconductor region may include depositing a Hf oxide, a Zn oxide, an In oxide, a Ga oxide, a Sn oxide, a Ti oxide, an InZn oxide, an InSn oxide, a HfInZn oxide, a GaInZn oxide, or a combination thereof to form an oxide semiconductor region having a thickness of about 0.03 μm to about 1 μm.

The forming of the intrinsic region may further include forming a polycrystalline silicon layer by crystallizing the amorphous silicon layer.

Embodiments may also be realized by providing a photo sensor including a substrate, a buffer layer formed on the substrate, the photo diode described above formed on the buffer layer, and an electrode formed on the photo diode.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1A:
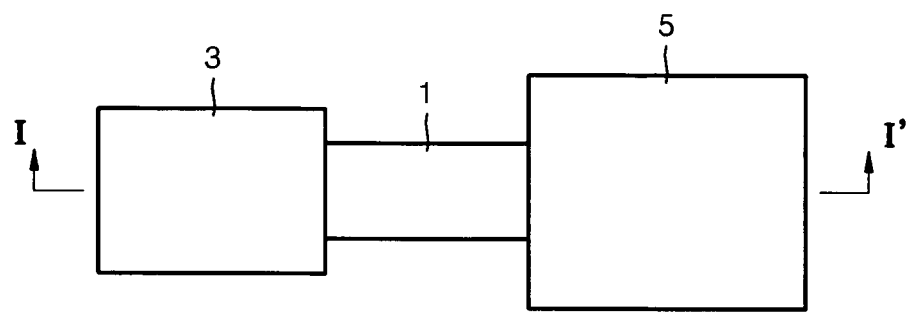
FIG. 1A illustrates a schematic plan view of a photo diode according to an exemplary embodiment.

Korean Patent Application No. 10-2010-0108411, filed on Nov. 2, 2010, in the Korean Intellectual Property Office, and entitled: "Photo Diode, Method of Manufacturing the Photo Diode, and Photo Sensor Including the Photo Diode," is incorporated by reference herein in its entirety.

Example embodiments, and the structure and operation of the exemplary embodiments, will now be described more fully hereinafter with reference to the accompanying drawings; however, they may be embodied in different forms and should not be construed as limited to the embodiments set forth herein. Rather, these embodiments are provided so that this disclosure may be thorough and complete. The present invention may be embodied in various other forms and may be limited to the exemplary embodiments presented herein.

In the figures, the dimensions of layers and regions may be exaggerated for clarity of illustration. Throughout the specification, like reference numerals denote like elements. It will also be understood that when an element, e.g., a layer, a film, or a region, are referred to as being "on" another element, e.g., another layer or a substrate, it can be directly on the other element, or intervening elements may also be present.

FIG. 1A illustrates a schematic plan view of a photo diode according to an exemplary embodiment. Referring to FIG. 1A, the photo diode may include an intrinsic region 1 formed on a substrate (not shown), a P+ doping region 3 formed by doping a portion of the intrinsic region 1, and an oxide semiconductor region 5 formed on an upper surface of another portion of the intrinsic region 1. The intrinsic region 1 may be interposed between the P+ doping region 3 and the oxide semiconductor region 5.

Figure 1B:
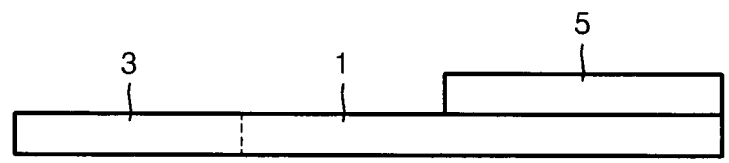
FIG. 1B illustrates a cross-sectional view taken along a line I-I' of FIG. 1A.

FIG. 1B illustrates a cross-sectional view taken along a line I-I' of FIG. 1A. Referring to FIG. 1B, in the photo diode, the intrinsic region 1, and the P+ doping region 3 may lie on the same plane. The intrinsic region 1 and the P+ doping region 3 may have a horizontal structure, e.g., the P+ doping region 3 may be disposed adjacent to an undoped portion of the intrinsic region 1. The oxide semiconductor region 5 may be disposed on an upper surface of the intrinsic region 1, e.g., the intrinsic region 1 may be under the oxide semiconductor region 5. Thus, the oxide semiconductor region 5 and the intrinsic region 1 may have a vertical structure.

Referring to FIG. 1B, the intrinsic region 1 may contact the P+ doping region 3 having, e.g., a relatively high work function, and the oxide semiconductor region 5 having, e.g., a relatively low work function. Without intending to be bound by this theory, a depletion region having a sufficiently great thickness may be formed at the intrinsic region 1 between the oxide semiconductor region 5 and the P+ doping region 3, and a rectification phenomenon may occur. For example, since in the photo diode the intrinsic region 1 and the P+ doping region 3 may have a horizontal structure, a depletion region may be determined mainly according to a width of the intrinsic region 1 interposed between the P+ doping region 3 and the oxide semiconductor region 5. The width of the intrinsic region 1 may be controlled by controlling a size of the P+ doping region 3 or the oxide semiconductor region 5 that is, e.g., controlled by controlling an ion implantation region or an oxide deposition region, and thereby, a size of the depletion region may also be controlled.

The intrinsic region 1 may be formed by depositing a material, e.g., amorphous silicon, on the substrate to form a layer 1a, e.g., an amorphous silicon layer 1a. The amorphous silicon layer 1a may not be doped with impurities and may have a high resistance. Since the amorphous silicon layer 1a may have high resistance, the amorphous silicon layer 1a may be appropriate for use as the intrinsic region 1.

The intrinsic region 1 may be formed by, e.g., performing a CVD chemical vapor deposition (CVD) on the substrate using, e.g., $SiH_4$ gas to form the amorphous silicon layer 1a. According to another exemplary embodiment, a polycrystalline silicon layer 1b may be formed by crystallizing the amorphous silicon layer 1a.

A thickness of the intrinsic region 1 may be in a range of about 0.03 μm to about 1 μm. Without intending to be bound by this theory, if the thickness of the intrinsic region 1 is within the range described above, the intrinsic region 1 may have an appropriate resistance. For example, the thickness of the intrinsic region 1 may be about 0.05 μm.

The oxide semiconductor region 5 may include an Hf oxide, a Zn oxide, an In oxide, a Ga oxide, a Sn oxide, a Ti oxide, an InZn oxide, an InSn oxide, a HfInZn oxide, a GaInZn oxide, or a combination thereof. The oxide semiconductor region 5 may act as an N-type semiconductor in a P-I-N diode, e.g., in a manner similar to an N-type semiconductor in a conventional P-I-N diode. According to an exemplary embodiment, oxide semiconductor region 5 may include the HfInZn oxide. For example, the oxide semiconductor region 5 may include $HfInZnO_x$ where $0<x\leq2.5$. Without intending to be bound by this theory, $Zn^{2+}$ may be present outside a lattice due to naturally generated Zn interstitial and O (oxygen) vacancy or is not combined with O (oxygen) and may act as an acceptor, and thus, $HfInZnO_x$ may act as an N-type semiconductor. Likewise, a Hf oxide, a Zn oxide, an In oxide, a Ga oxide, a Sn oxide, a Ti oxide, an InZn oxide, an InSn oxide, a HfInZn oxide, a GaInZn oxide may act as an N-type semiconductor due to, e.g., an O vacancy. For example, the oxide semiconductor region 5 may include HfInZn oxide or GaInZn oxide.

A thickness of the oxide semiconductor region 5 may be in a range of about 0.03 μm to about 1 μm. Without intending to be bound by this theory, if the thickness of the oxide semiconductor region 5 is within the range described above, an appropriate amount of current may flow through the photo diode. For example, the thickness of the oxide semiconductor region 5 may be about 0.05 μm.

The P+ doping region 3 may be formed by implanting a Group III impurity ion into a portion of the intrinsic region 1 on the substrate. The formation method of the P+ doping region 3 is not limited thereto. For example, the P+ doping region 3 may be any one of an epitaxial layer, a CVD deposition layer, and a diffusion layer.

The P+ doping region 3 may be formed by implanting a Group III impurity ion into a portion of the intrinsic region 1 that is to be the P+ doping region while the other portions of the intrinsic region 1 are masked. For example, the P+ doping region 3 may be formed by implanting a Group III impurity ion, such as at least one of or one of boron (B) ion, $BF_2$ ion, and $B_2H_5$ ion. The P+ doping region 3 may have a relatively high work function and a low specific resistance compared to the oxide semiconductor region 5.

A thickness of the P+ doping region 3 may be in a range of about 0.03 to about 1 μm. Without intending to be bound by this theory, if the thickness of the P+ doping region 3 is within the range described above, an appropriate amount of current may flow. For example, the thickness of the P+ doping region 3 may be about 0.05 μm.

An ion concentration of the P+ doping region 3 may be in a range of about $1.0^{10}$ atom/cm$^2$ to about $1.0^{16}$ atom/cm$^2$. Without intending to be bound by this theory, if the ion concentration of the P+ doping region 3 is equal to or greater than $1.0^{10}$ atom/cm$^2$, when light is irradiated to the photo diode, a photo current may appropriately flow through the photo diode. On the other hand, if the ion concentration of the P+ doping region 3 is equal to or lower than $1.0^{16}$ atom/cm$^2$, recombination or interruption of a photo current generated by irradiation of light does not occur and thus, a photo current may not excessively increase. For example, the ion concentration of the P+ doping region 3 may be about $1.0^{12}$ atom/cm$^2$.

FIGS. 2A, 3A, 4A, and 5A illustrate schematic plan views for explaining an exemplary method of manufacturing the photo diode of FIG. 1 including the intrinsic region 1 formed of, e.g., amorphous silicon, according to an exemplary embodiment, and FIGS. 6A, 7A, 8A, 9A, and 10A illustrate schematic plan views for explaining an exemplary method of manufacturing the photo diode of FIG. 1 including the intrinsic region 1 formed of, e.g., polycrystalline silicon, according to another exemplary embodiment.

A method of manufacturing a photo diode according to an exemplary embodiment will be described with reference to FIGS. 2A, 3A, 4A, and 5A. FIGS. 2B, 3B, 4B, and 5B illustrate cross-sectional views taken along lines I-I' of FIGS. 2A, 3A, 4A, and 5A, respectively.

Figure 2A:
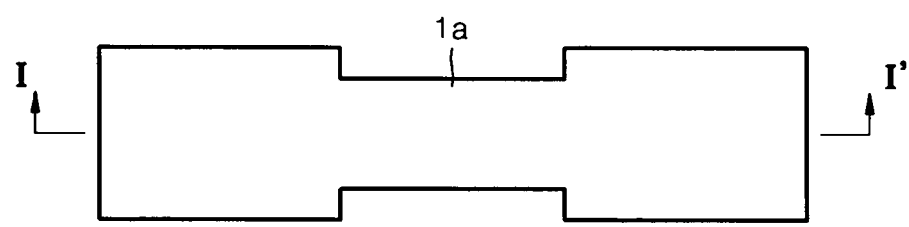
FIGS. 2A, 3A, 4A, and 5A illustrate schematic plan views for depicting and disclosing a method of manufacturing a photo diode including an intrinsic region, e.g., a region formed of amorphous silicon, according to an exemplary embodiment.
Figure 2B:
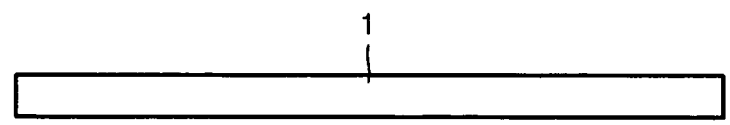
FIGS. 2B, 3B, 4B, and 5B illustrate cross-sectional views taken along lines I-I' of FIGS. 2A, 3A, 4A, and 5A, respectively.

First, referring to FIGS. 2A and 2B, the intrinsic region 1 may include an amorphous silicon layer 1a formed on a substrate. The substrate may be any one of various substrates including a glass substrate, a hard plastic substrate, and a flexible plastic substrate. After the intrinsic region 1 is formed by depositing the amorphous silicon layer 1a on the substrate, a natural oxide layer or an organic material present on the amorphous silicon layer 1a may be cleaned before implanting impurity ions.

Although not illustrated, a buffer layer such as a Cu oxide layer may be further formed between the substrate and the intrinsic region 1. In this regard, the buffer layer may contribute to thermal stability of the photo diode. If the buffer layer is formed, the photo diode may include the buffer layer, the intrinsic region 1, the P+ doping region 3, and the oxide semiconductor region 5.

Figure 3A:
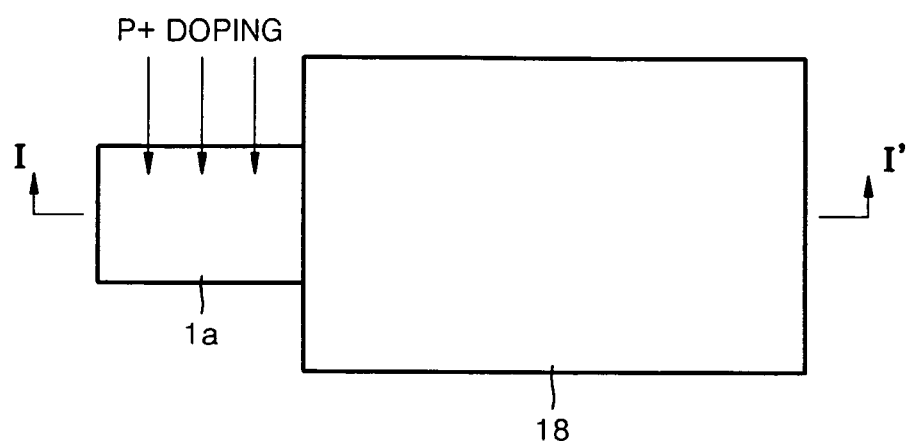
Figure 3B:
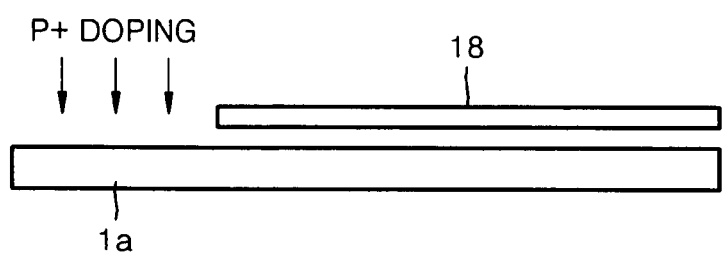

Then, referring to FIGS. 3A and 3B, an impurity ion may be doped on a portion of the intrinsic region 1 to form the P+ doping region 3. This process may include, e.g., masking the other portions of the intrinsic region 1 with a mask 18 formed of a photoresist (PR). This process may include using a semiconductor photolithography process, e.g., by implanting a Group III impurity ion on an un-masked region, and removing the mask 18.

The mask 18 may be formed of photoresist, but the material for forming the mask 18 may not be limited thereto. For example, the mask 18 may instead be formed of one of or at least one of $SiO_2$ and $Si_3N_4$. The mask 18 formed as described above may cover the other portions of the intrinsic region 1 and may leave open, e.g., exposed, only the portion of the intrinsic region 1 that is to be the P+ doping region 3. The region that is to be the P+ doping region 3 may be P+ doped with any one of Group III impurity ions, including a boron (B) ion, a $BF_2$ ion, and a $B_2H_5$ ion. A doping material for P+ doping may be, e.g., boron (B), $BF_2$, or $B_2H_5$. In this regard, a thickness of the P+ doping region 3 may be in a range of about 0.03 μm to about 1 μm. The ion implantation in the P+ doping region 3 may be performed with an energy intensity of about 5 KeV to about 50 KeV so that the implanted ion concentration may be in a range of about $1.0^{10}$ to about $1.0^{16}$ atom/cm$^2$. Without intending to be bound by this theory, if the thickness of the P+ doping region 3 is within the range described above, an appropriate amount of a photo current may flow through the photo diode. For example, the thickness of the P+ doping region 3 may be about 0.05 μm. A material for P+ doping, a process of forming the P+ doping region 3, and process conditions may not be limited thereto and may differ according to purpose.

As described above, a P+ silicon layer may be formed by implanting a Group III impurity ion into a portion, e.g., a first portion, of the amorphous silicon, thereby forming the P+ doping region 3. Once the P+ doping region 3 is formed, the mask 18 may be removed by removing the photoresist pattern.

Figure 4A:
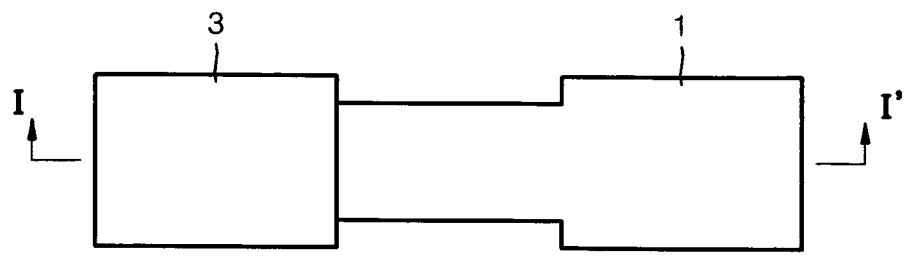
Figure 4B:

FIGS. 4A and 4B show that the P+ doping region 3 may be formed in the first portion of the intrinsic region 1.

Figure 5A:
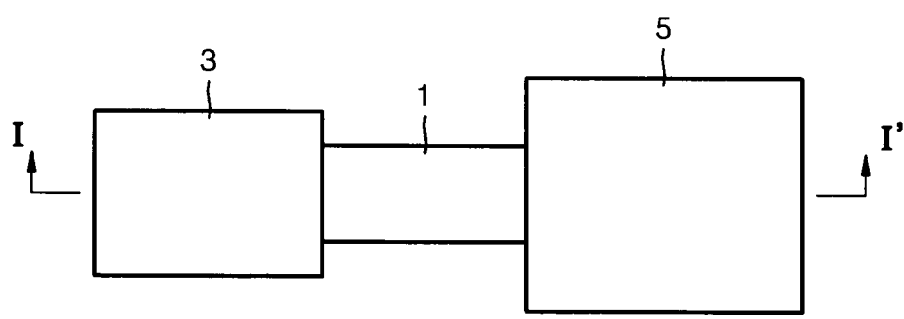
Figure 5B:
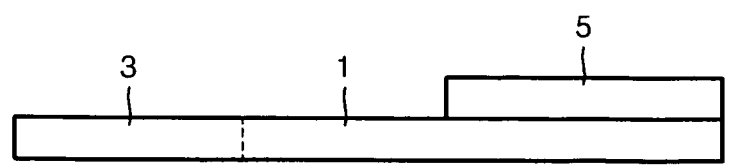

Referring to FIGS. 5A and 5B, the oxide semiconductor region 5 may be formed to be spaced apart from the P+ doping region 3 on a portion, e.g., a second portion, of the intrinsic region 1. The second portion of the intrinsic region 1 may be different from the first portion of the intrinsic region 1 that includes the P+ doping region 3. For example, the oxide semiconductor region 5 may be formed on a portion of the intrinsic region 1 that is spaced apart from the P+ doping region 3 and is not doped. The oxide semiconductor region 5 may be formed on a portion of the intrinsic region 1 without using masking.

The oxide semiconductor region 5 may be formed using Hf oxide, Zn oxide, In oxide, Ga oxide, Sn oxide, Ti oxide, InZn oxide, InSn oxide, HfInZn oxide, GaInZn oxide, or a combination thereof. For example, the oxide semiconductor region 5 may be formed using HfInZn oxide or GaInZn oxide. In this regard, the oxide semiconductor region 5 may be formed by RF magnetron sputtering at low temperature. A thickness of the oxide semiconductor region 5 may be in a range of about 0.03 μm to about 1 μm. Without intending to be bound by this theory, if the thickness of the oxide semiconductor region 5 is within the range described above, an appropriate amount of a photo current may flow through the photo diode. For example, the thickness of the oxide semiconductor region 5 may be about 0.05 μm. A material for forming the oxide semiconductor region 5, a process of forming the oxide semiconductor region 5, and formation conditions may not be limited thereto and may differ according to purpose.

FIGS. 6A, 7A, 8A, 9A, and 10A illustrate schematic plan views for explaining a method of manufacturing the photo diode of FIG. 1 including the intrinsic region 1 that is formed of, e.g., polycrystalline silicon, according to an exemplary embodiment, and FIGS. 6B, 7B, 8B, 9B, and 10B illustrate cross-sectional views taken along lines I-I' of FIGS. 6A, 7A, 8A, 9A, and 10A.

Figure 6A:
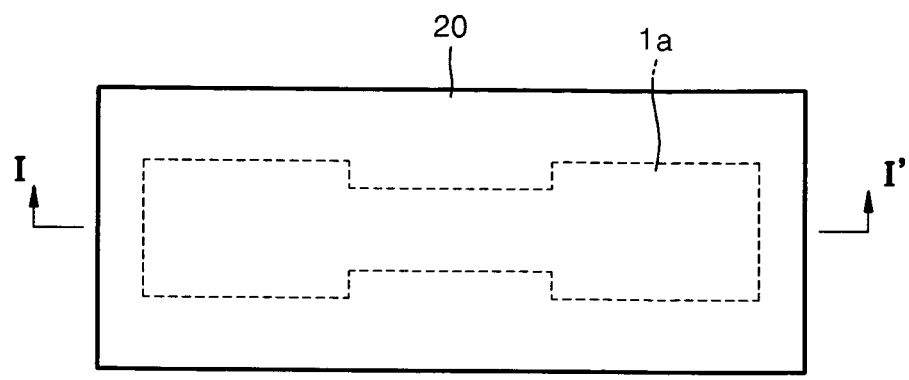
FIGS. 6A, 7A, 8A, 9A, and 10A illustrate schematic plan views for depicting and disclosing a method of manufacturing a photo diode including an intrinsic region, e.g., a region formed of polycrystalline silicon, according to another exemplary embodiment.
Figure 6B:
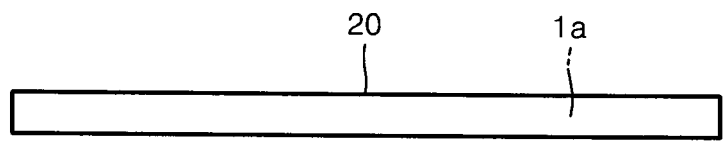
FIGS. 6B, 7B, 8B, 9B, and 10B are cross-sectional views taken along lines I-I' of FIGS. 6A, 7A, 8A, 9A, and 10A.

Referring to FIGS. 6A and 6B, a layer 1a, e.g., an amorphous silicon layer 1a, may be deposited on the substrate. The layer 1a, e.g., the amorphous silicon layer 1a, may then be thermally oxidized to form a crystallized region 20, thereby changing the amorphous silicon layer 1a into a polycrystalline silicon layer 1b. Like in the method according to the previous embodiment, a natural oxide layer and/or an organic material present on the polycrystalline silicon layer 1b may be cleaned before impurity ions are implanted. Although not illustrated, a buffer layer, such as a Cu oxide layer, may be further formed between the substrate and the intrinsic region 1.

Figure 7A:
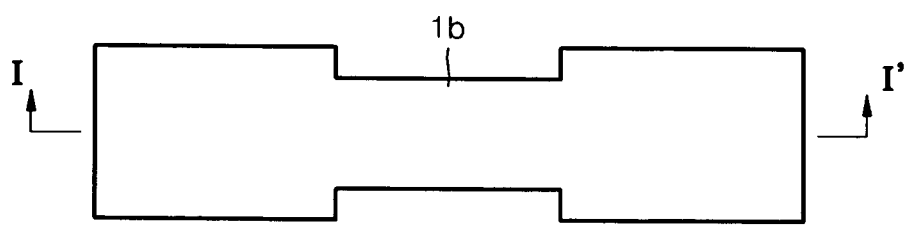
Figure 7B:
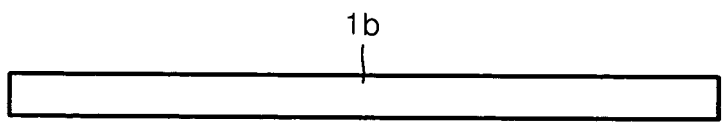

Referring to FIGS. 7A and 7B, a layer, e.g., the polycrystalline silicon layer 1b, may be formed in the intrinsic region 1 including.

Figure 8A:
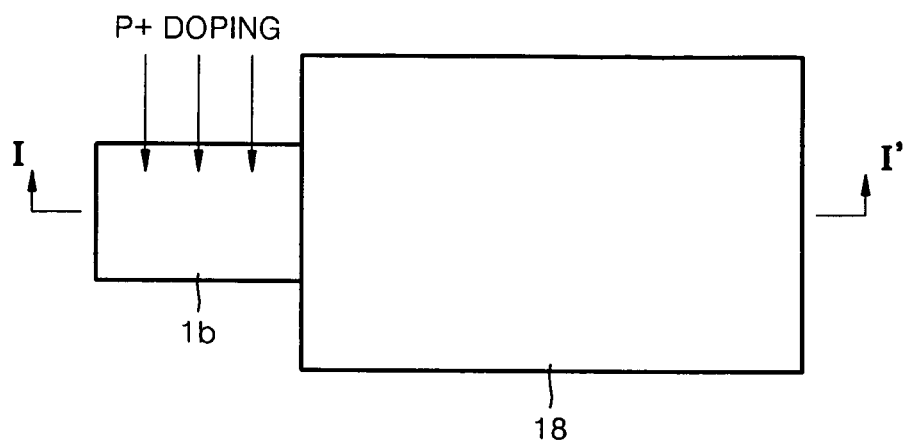
Figure 8B:
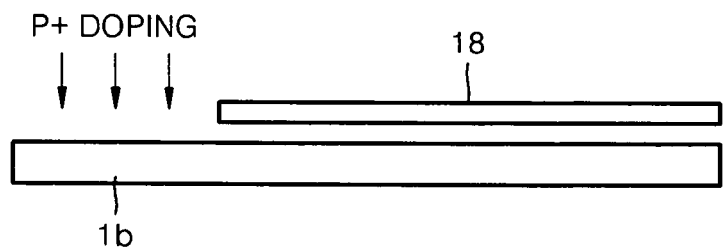

Referring to FIGS. 8A and 8B, an impurity ion may be doped on a portion of the intrinsic region 1 including the polycrystalline silicon layer 1b to form the P+ doping region 3. This process may include, e.g., masking the other portions of the intrinsic region 1 with a mask 18 formed of a photoresist (PR), implanting a Group III impurity ion into an un-masked region, and removing the mask 18. A material for P+ doping, a process of forming the P+ doping region 3, and process conditions may be the same as described with reference to the intrinsic region 1 including the amorphous silicon layer 1a.

Figure 9A:
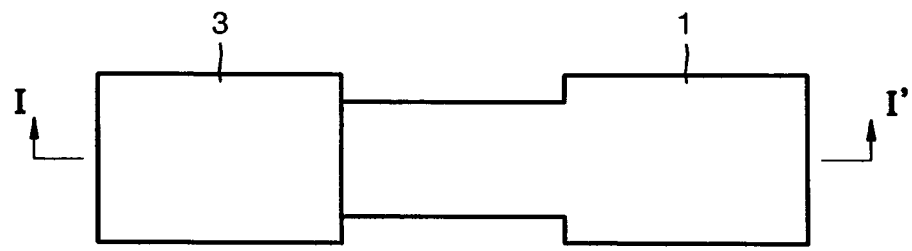
Figure 9B:

Referring to FIGS. 9A and 9B, the P+ doping region 3 may be formed in a portion, e.g., a first portion, of the intrinsic region 1. The intrinsic region 1 may include the polycrystalline silicon layer 1b.

Figure 10A:
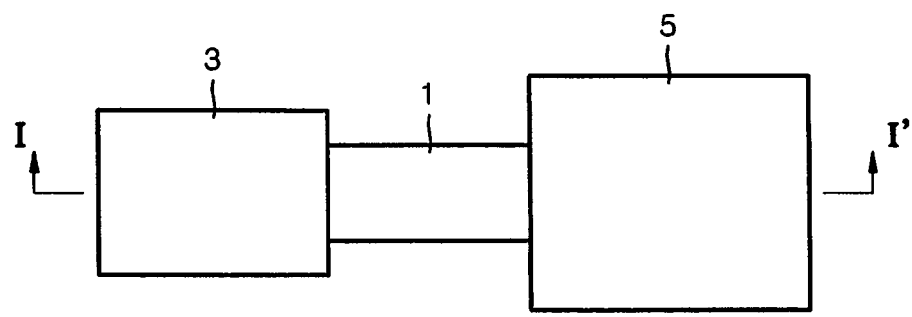
Figure 10B:
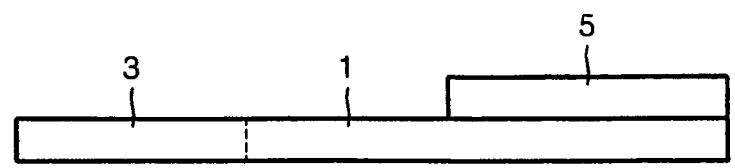

Then, referring to FIGS. 10A and 10B, the oxide semiconductor region 5 may be formed to be spaced apart from the P+ doping region 3 on a portion, e.g., a second portion, of the intrinsic region 1 including the polycrystalline silicon layer 1b. The second portion of the intrinsic region 1 may be different from the first portion of the intrinsic region 1 including the P+ doping region 3. A material for forming the oxide semiconductor region 5, a process of forming the oxide semiconductor region 5, and process conditions may be the same as described above with reference to the intrinsic region 1 including the amorphous silicon layer 1a.

Photo diodes formed using the methods described above may have the following exemplary structures.

For example, a photo diode may include an intrinsic region 1 including amorphous silicon formed on a substrate, a P+ doping region 3 including a B ion formed in a portion of the intrinsic region 1, and an oxide semiconductor region 5 including HfInZn oxide formed to be spaced apart from the P+ doping region 3 on another portion of the intrinsic region 1.

As another example, a photo diode may include an intrinsic region 1 including polycrystalline silicon formed on a substrate, a P+ doping region 3 including a B ion formed in a portion of the intrinsic region 1, and an oxide semiconductor region 5 that includes HfInZn oxide, and is spaced apart from the P+ doping region 3 formed on another portion of the intrinsic region 1.

Figure 11:
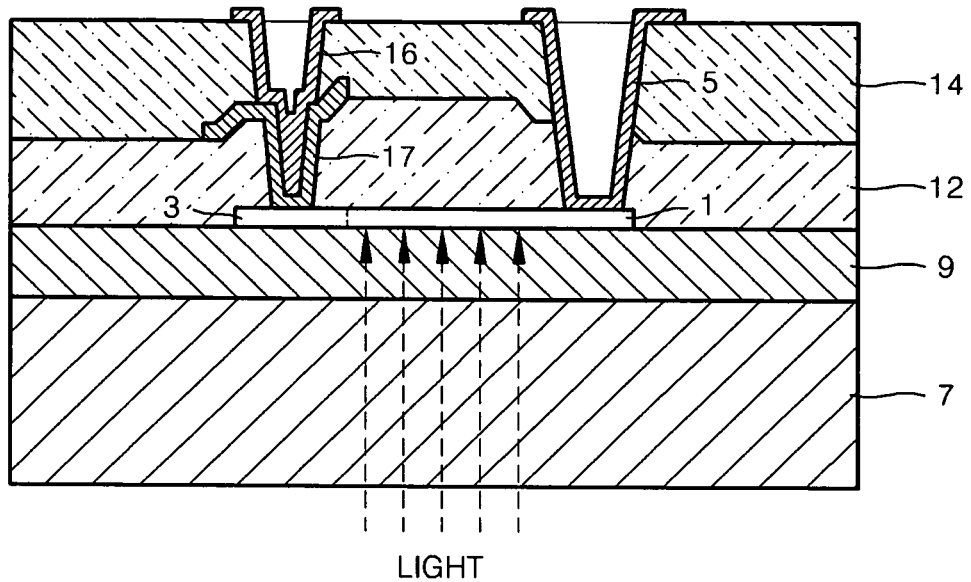
FIGS. 11 and 12 illustrate plan views of a photo sensor, according to exemplary embodiments.

FIG. 11 is plan view of a photo sensor according to an exemplary embodiment. Referring to FIG. 11, the photo sensor may include a substrate 7, a buffer layer 9 formed on the substrate 7, a photo diode 1 formed on the buffer layer 9, and an electrode 16 formed on the photo diode.

First, the substrate 7 may be provided and the buffer layer 9 may be formed on the substrate 7. In another embodiment, the buffer layer 9 may not be formed. Materials for forming the substrate 7 and the buffer layer 9 are the same as described above. The photo diode 1 may be formed on the buffer layer 9. The photo diode 1 may have an intrinsic region 1, a P+ doping region 3 formed in a portion of the intrinsic region 1, and an oxide semiconductor region 5 formed to be spaced apart from the P+ doping region 3 on another portion of the intrinsic region 1. The photo sensor may further include a first insulating layer 12 for insulating an activation layer of the photo diode, and a second insulating layer 14 for protecting the photo diode 1 from, e.g., water molecules. The electrode 16 may be formed to penetrate the first insulating layer 12, and an oxide semiconductor 17 penetrating the second insulating layer 14 may be formed on and may be connected to the electrode 16. The electrode 16 may be connected to the P+ doping region 3. The electrode 16 may be connected to an external power supplier so as to, e.g., allow holes to be injected to the P+ doping region 3. The electrode 16 may be formed of a metal material such as one of or at least one of Au, Al, or Ag, and a transparent conductive material such as indium tin oxide (ITO).

Figure 12:
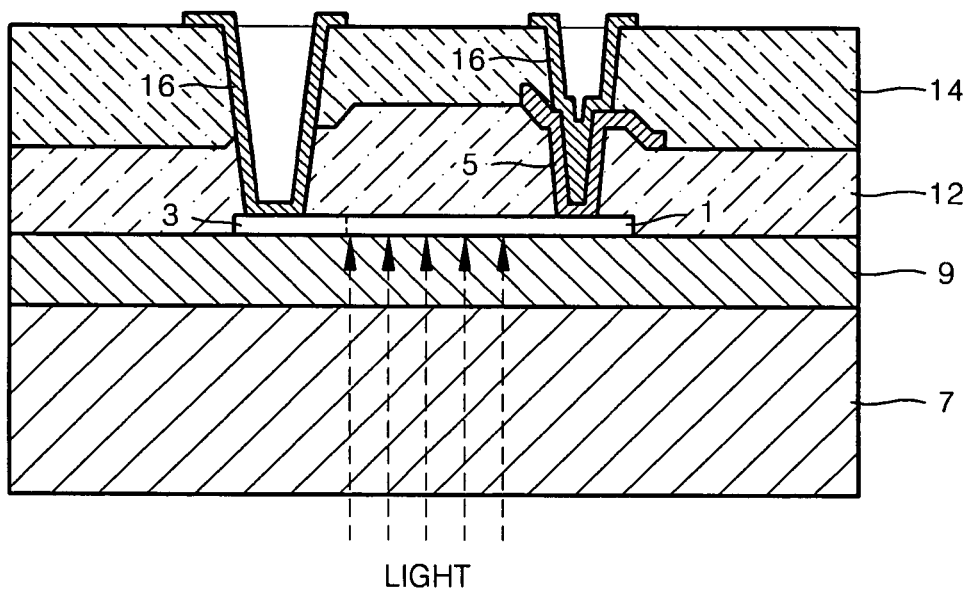

FIG. 12 illustrates a plan view of a photo sensor according to an exemplary embodiment. Referring to FIG. 12, the photo sensor may include a substrate 7, a buffer layer 9 formed on the substrate 7, a photo diode 1 formed on the buffer layer 9, and electrodes 16 formed on the photo diode.

First, the substrate 7 may be provided and the buffer layer 9 may be formed on the substrate 7. In another embodiment, the buffer layer 9 may not be formed. The photo diode 1 may be formed on the buffer layer 9. The photo diode 1 may have an intrinsic region 1, a P+ doping region 3 formed in a portion of the intrinsic region 1, and an oxide semiconductor region 5 formed to be spaced apart from the P+ doping region 3 on another portion of the intrinsic region 1. The photo sensor may further include a first insulating layer 12 for insulating an activation layer of the photo diode, and a second insulating layer 14 for protecting the photo diode 1 from, e.g., water molecules. One of the electrodes 16 may be formed on the P+ doping region 3. One of the electrodes 16 may penetrate the first insulating layer 12 and the second insulating layer 14. The oxide semiconductor region 5 may penetrate the first insulating layer 12, and the other electrode 16 may penetrate the second insulating layer 14 formed on the oxide semiconductor region 5. For example, the other electrode 16 may penetrate an area of the second insulating layer 14 above the oxide semiconductor region 5.

Unlike a conventional photo diode having a P-I-N structure formed by performing P+ doping and N+ doping, according to the above embodiments of the present invention, only one P+ doping is performed. Thus, a photo diode having a simple structure can be formed using a simplified manufacturing process.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A photo diode, comprising:
a P-I-N structure that includes:
an intrinsic region on a substrate, wherein the intrinsic region includes amorphous silicon and/or polycrystalline silicon;
a P+ doping region in a first portion of the intrinsic region, the P+ doping region being a P-type semiconductor of the P-I-N structure; and
an oxide semiconductor region that is an N-type semiconductor of the P-I-N structure, the oxide semiconductor region being spaced apart from the P+ doping region and being separate from and on a second portion of the intrinsic region, the second portion of the intrinsic region being different from the first portion of the intrinsic region.

2. The photo diode as claimed in claim 1, wherein the intrinsic region and the P+ doping region lie within a first plane that overlaps an entirety of the substrate and the oxide semiconductor region is excluded from the first plane.

3. The photo diode as claimed in claim 1, wherein:
the oxide semiconductor region includes at least one of a Hf oxide, a Zn oxide, an In oxide, a Ga oxide, a Sn oxide, a Ti oxide, an InZn oxide, an InSn oxide, a HfInZn oxide, and a GaInZn oxide such that the oxide semiconductor region is the N-type semiconductor of the P-I-N structure,
the intrinsic region and the P+ doping region include silicon, and
the intrinsic region is electrically connected to the oxide semiconductor region and the P+ doping region.

4. The photo diode as claimed in claim 1, wherein the oxide semiconductor region includes one of an HfInZn oxide and a GaInZn oxide.

5. The photo diode as claimed in claim 1, wherein a thickness of the oxide semiconductor region is in a range of about 0.03 μm to about 1 μm.

6. The photo diode as claimed in claim 1, wherein the P+ doping region includes a Group III impurity ion.

7. The photo diode as claimed in claim 1, wherein the P+ doping region includes one of a boron (B) ion, a $BF_2$ ion, and a $B_2H_5$ ion.

8. The photo diode as claimed in claim 1, wherein an ion concentration of the P+ doping region is in a range of about $1.0^{10}$ atom/cm$^2$ to about $1.0^{16}$ atom/cm$^2$.

9. The photo diode as claimed in claim 1, wherein a thickness of the P+ doping region is in a range of about 0.03 μm to about 1 μm.

10. The photo diode as claimed in claim 1, wherein a thickness of the intrinsic region is in a range of about 0.03 μm to about 1 μm.

11. A photo diode, comprising:
a P-I-N structure that includes:
an intrinsic region on a substrate, the intrinsic region including amorphous silicon;
a P+ doping region in a first portion of the intrinsic region, the P+ doping region being a P-type semiconductor of the P-I-N structure that includes a B ion; and
an oxide semiconductor region that is an N-type semiconductor of the P-I-N structure and that includes HfInZn oxide, the oxide semiconductor region being spaced apart from the P+ doping region and being separate from and on a second portion of the intrinsic region, the second portion of the intrinsic region being different from the first portion of the intrinsic region.

12. A photo diode, comprising:
a P-I-N structure that includes:
an intrinsic region on a substrate, the intrinsic region including polycrystalline silicon;
a P+ doping region in a first portion of the intrinsic region, the P+ doping region being a P-type semiconductor of the P-I-N structure that includes a B ion; and
an oxide semiconductor region that is an N-type semiconductor of the P-I-N structure and that includes HfInZn oxide, the oxide semiconductor region being spaced apart from the P+ doping region and being separate from and on a second portion of the intrinsic region, the second portion of the intrinsic region being different from the first portion of the intrinsic region.

13. A method of manufacturing a photo diode that has a P-I-N structure, the method comprising:
providing a substrate;
forming an intrinsic region by depositing an amorphous silicon layer on the substrate;
forming a P-type semiconductor of the P-I-N structure includes forming a P+ doping region by doping an impurity ion on a first portion of the intrinsic region; and
forming an N-type semiconductor of the P-I-N structure includes forming an oxide semiconductor region to be spaced apart from the P+ doping region and to be separate from and on a second portion of the intrinsic region, the second portion of the intrinsic region being different from the first portion of the intrinsic region.

14. The method as claimed in claim 13, wherein the forming of the P+ doping region includes:
forming a mask covering an area of the intrinsic region other than the first portion of the intrinsic region on which the impurity ion is to be doped,
implanting a Group III impurity ion into the first portion of the intrinsic region; and removing the mask.

15. The method as claimed in claim 14, wherein, in the implanting of the Group III impurity ion, a boron (B) ion, a $BF_2$ ion, or a $B_2H_5$ ion is implanted with an energy intensity of about 1 to about 50 KeV such that an implanted ion concentration in the P+ doping region is in a range of about $1.0^{10}$ atom/cm$^2$ to about $1.0^{16}$ atom/cm$^2$.

16. The method as claimed in claim 13, wherein the forming of the oxide semiconductor region includes depositing at least one of a Hf oxide, a Zn oxide, an In oxide, a Ga oxide, a Sn oxide, a Ti oxide, an InZn oxide, an InSn oxide, a HfInZn oxide, and a GaInZn oxide on the intrinsic region such that the oxide semiconductor region has a thickness of about 0.03 μm to about 1 μm.

17. The method as claimed in claim 13, wherein the forming of the intrinsic region further includes forming a polycrystalline silicon layer by crystallizing the amorphous silicon layer.

18. A photo sensor comprising:
the photo diode as claimed in claim 1,
a buffer layer under the photo diode, and
an electrode on the photo diode.

* * * * *